(12) United States Patent
Hashizume et al.

(10) Patent No.: US 10,889,086 B2
(45) Date of Patent: Jan. 12, 2021

(54) RESIN FILM, SUBSTRATE FOR PRINTED WIRING BOARD, AND PRINTED WIRING BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Kayo Hashizume, Osaka (JP); Yoshio Oka, Osaka (JP); Masamichi Yamamoto, Osaka (JP); Takashi Kasuga, Osaka (JP); Yugo Kubo, Osaka (JP); Hideki Kashihara, Shiga (JP); Hiroshi Ueda, Shiga (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 0 days.

(21) Appl. No.: 16/636,759

(22) PCT Filed: Mar. 20, 2018

(86) PCT No.: PCT/JP2018/010915
§ 371 (c)(1),
(2) Date: Feb. 5, 2020

(87) PCT Pub. No.: WO2019/035237
PCT Pub. Date: Feb. 21, 2019

(65) Prior Publication Data
US 2020/0376810 A1    Dec. 3, 2020

(30) Foreign Application Priority Data
Aug. 14, 2017   (JP) .................. 2017-156511

(51) Int. Cl.
*H05K 1/03*   (2006.01)
*B32B 15/08*  (2006.01)
(Continued)

(52) U.S. Cl.
CPC .............. *B32B 15/08* (2013.01); *B32B 15/20* (2013.01); *B32B 27/281* (2013.01); *C08J 5/18* (2013.01);
(Continued)

(58) Field of Classification Search
CPC ..................................... H05K 1/0313–1/0346
See application file for complete search history.

(56) References Cited

U.S. PATENT DOCUMENTS

| | | | |
|---|---|---|---|
| 6,544,664 | B1 | 4/2003 | Takahashi et al. |
| 2016/0060483 | A1 | 3/2016 | Matsuno et al. |
| 2018/0371191 | A1 | 12/2018 | Hashizume et al. |

FOREIGN PATENT DOCUMENTS

| | | |
|---|---|---|
| JP | 2000-340911 | 12/2000 |
| WO | 2015/079717 | 6/2015 |
| WO | 2017/090625 | 6/2017 |

*Primary Examiner* — Jeremy C Norris
(74) *Attorney, Agent, or Firm* — IPUSA, PLLC

(57) ABSTRACT

A resin film according to one aspect of the present invention is a resin film having polyimide as a main component, the resin film including a modified layer formed in a depth direction from at least one side of the resin film; and a non-modified layer other than the modified layer, wherein a ring-opening rate of an imide ring of the polyimide in the modified layer is higher than a ring-opening rate of an imide ring of the polyimide in the non-modified layer, and an average thickness of the modified layer from the one side of the resin film is greater than or equal to 10 nm and less than or equal to 500 nm.

6 Claims, 2 Drawing Sheets

(51) Int. Cl.
*H05K 1/05* (2006.01)
*B32B 27/28* (2006.01)
*B32B 15/20* (2006.01)
*C08J 5/18* (2006.01)

(52) U.S. Cl.
CPC ......... *H05K 1/0326* (2013.01); *H05K 1/0346* (2013.01); *H05K 1/056* (2013.01); *B32B 2457/08* (2013.01); *C08J 2379/08* (2013.01); *H05K 2201/0358* (2013.01)

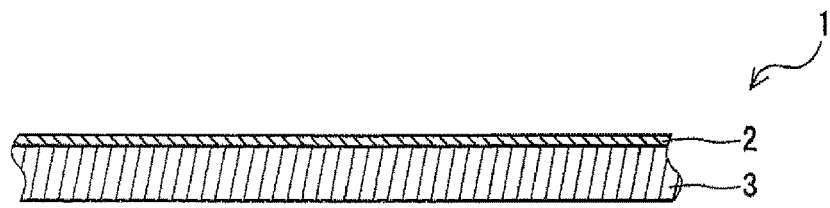
FIG.1
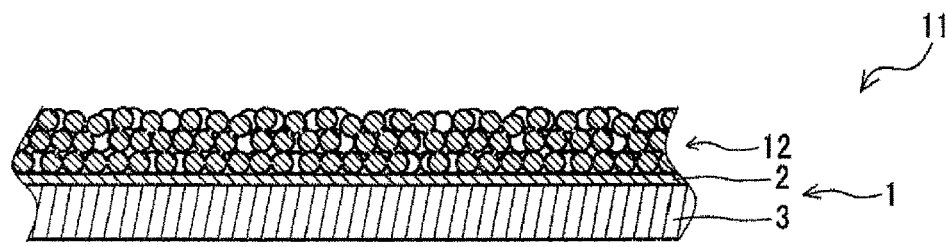
FIG.2
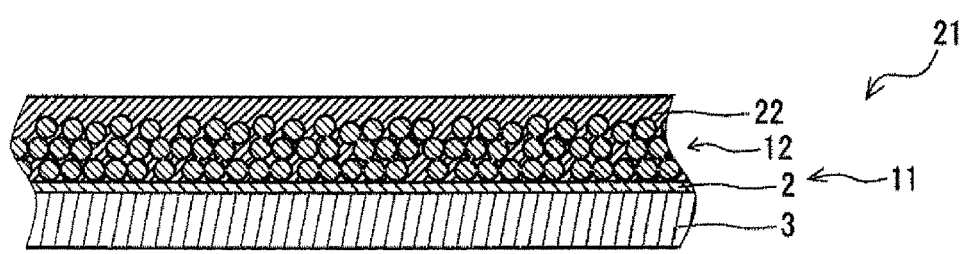
FIG.3
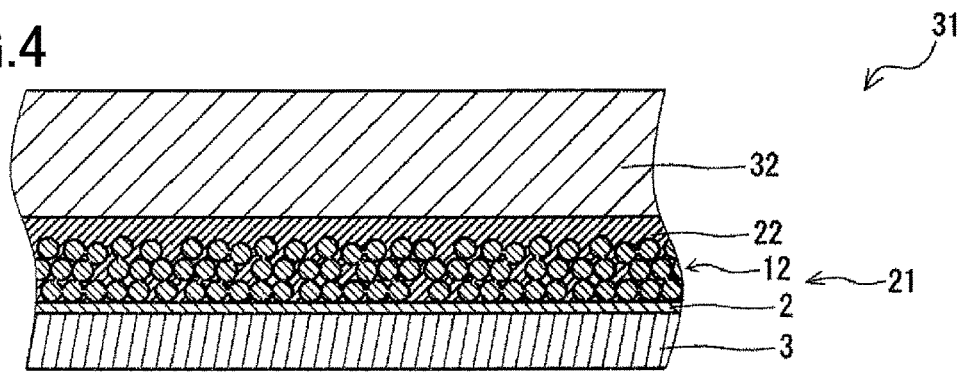
FIG.4
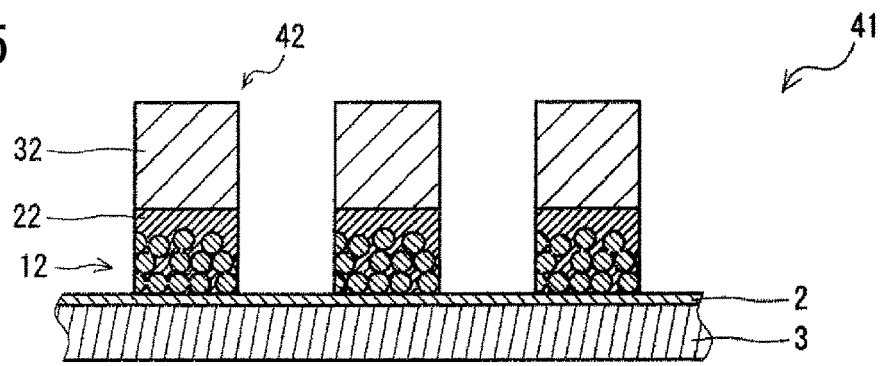
FIG.5
FIG.6A
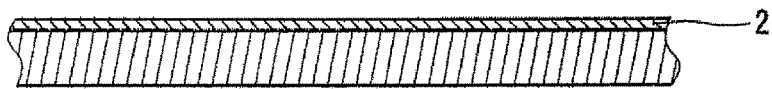

RESIN FILM, SUBSTRATE FOR PRINTED WIRING BOARD, AND PRINTED WIRING BOARD

TECHNICAL FIELD

The present invention relates to a resin film, a substrate for a printed wiring board, and a printed wiring board.

The present international patent application claims the benefit of priority of Japanese Priority Patent Application No. 2017-156511, filed on Aug. 14, 2017, the entire contents of which Japanese Priority Patent Application No. 2017-156511 are hereby incorporated herein.

BACKGROUND ART

A substrate for a printed wiring board including an insulating base film formed of resin or the like and a metal layer laminated on the surface of the base film, is known. By forming a conductive pattern by patterning the metal layer in a planar view, the substrate for the printed wiring board is used as a printed wiring board.

A substrate for a printed wiring board is required to have an excellent adhesive force between the base film and the metal layer so that the conductive pattern does not peel off from the base film when bending stress is applied to the printed wiring board.

Further, in recent years, as electronic devices have become more compact in size and have improved in performance, printed wiring boards have been required to become higher in density. In a printed wiring board with higher density, as the conductive pattern becomes finer, the conductive pattern becomes easily peeled away from the base film. Therefore, from this point of view also, it is desirable for a substrate for a printed wiring board to have an excellent adhesive force between the base film and the metal layer.

In response to such a demand, there is known a technique for forming a metal layer on the surface of a base film by using, for example, a sputtering method and forming an electroplating layer on the metal layer by using an electroplating process. However, it is known that when the metal layer is directly laminated on the base film, with the passage of time, the main metal atoms of the metal layer diffuse into the base film, thereby reducing the adhesive force between the metal layer and the base film.

Accordingly, a technique has been proposed in which a metal chrome layer is deposited by sputtering on the bonding side with respect to the base film made of a copper foil constituting the metal layer, and then thermocompressed onto the base film (see Japanese Unexamined Patent Application Publication No. 2000-340911). In this manner, by interposing a thin film made of metal of a type different from the main metal of the metal layer at the interface between the metal layer and the base film, the movement of the main metal atoms of the metal layer to the base film is inhibited, thereby achieving the effect of preventing a decrease in the adhesive force between the metal layer and the base film due to diffusion of the main metal atoms of the metal layer to the base film.

CITATION LIST

Patent Literature

[PTL 1]
Japanese Unexamined Patent Application Publication No. 2000-340911

SUMMARY OF INVENTION

A resin film according to one aspect of the present invention is a resin film having polyimide as a main component, the resin film including a modified layer formed in a depth direction from at least one side of the resin film; and a non-modified layer other than the modified layer, wherein a ring-opening rate of an imide ring of the polyimide in the modified layer is higher than a ring-opening rate of an imide ring of the polyimide in the non-modified layer, and an average thickness of the modified layer from the one side of the resin film is greater than or equal to 10 nm and less than or equal to 500 nm.

A printed wiring board substrate according to another aspect of the present invention includes the resin film; and a metal layer laminated on a side of the resin film on which the modified layer is formed.

A printed wiring board according to another aspect of the present invention is a printed wiring board including a resin film having polyimide as a main component; and a metal layer laminated on at least one side of the resin film, wherein the metal layer is patterned in a planar view, and wherein the resin film includes a modified layer formed in a depth direction from the at least one side of the resin film on which the metal layer is laminated; and a non-modified layer other than the modified layer, wherein a ring-opening rate of an imide ring of the polyimide in the modified layer is higher than a ring-opening rate of an imide ring of the polyimide in the non-modified layer, and an average thickness of the modified layer from the at least one side of the resin film on which the metal layer is laminated is greater than or equal to 10 nm and less than or equal to 500 nm.

BRIEF DESCRIPTION OF DRAWINGS

FIG. 1 is a schematic cross-sectional view illustrating a resin film according to an embodiment of the present invention.

FIG. 2 is a schematic cross-sectional view illustrating a printed wiring board substrate using the resin film illustrated in FIG. 1.

FIG. 3 is a schematic cross-sectional view illustrating a printed wiring board substrate according to an embodiment different from that of the printed wiring board substrate in FIG. 2.

FIG. 4 is a schematic cross-sectional view of a printed wiring board substrate according to an embodiment different from that of the printed wiring board substrate of FIGS. 2 and 3.

FIG. 5 is a schematic cross-sectional view illustrating a printed wiring board using the printed wiring board substrate as illustrated in FIG. 4.

FIG. 6A is a schematic cross-sectional view illustrating a method for manufacturing the resin film of FIG. 1.

DESCRIPTION OF EMBODIMENTS

Figure 6B:
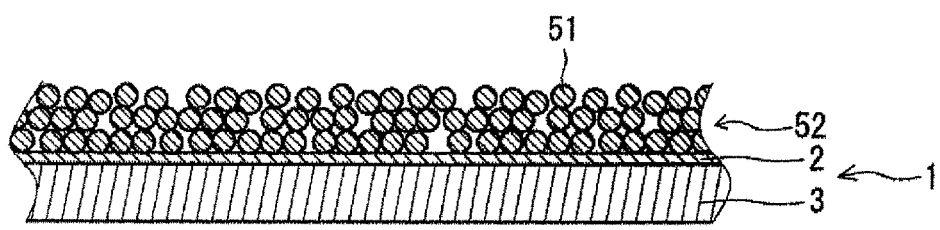
FIG. 6B is a schematic cross-sectional view illustrating a coating film forming process of a method of manufacturing the printed wiring board substrate in FIG. 2.

Problem to be Solved by Present Disclosure

In the conventional configuration described in the above-described publication, a metallic chrome layer is formed on the surface of the copper foil using a sputtering method, thereby requiring vacuum equipment and increasing the cost of construction, maintenance, operation, and the like of the equipment. Further, in terms of the equipment, there are limitations in increasing the size of the substrate.

The present invention is made based on the above-described circumstances, and a problem to be solved by the present invention is to provide a resin film having an excellent adhesive force with respect to a metal layer. Further, a problem to be solved by the present invention is to provide a substrate for a printed wiring board and a printed wiring board that are relatively inexpensive and that have an excellent adhesive force between a base film and a metal layer.

Effect of Disclosure

The resin film according to one aspect of the present invention has an excellent adhesive force with respect to a metal layer. Further, the substrate for the printed wiring board and the printed wiring board according to the present invention are relatively inexpensive and have an excellent adhesive force between a resin film and a metal layer.

DESCRIPTION OF EMBODIMENTS OF THE PRESENT INVENTION

First, descriptions of embodiments of the present invention will be cited.

A resin film according to one aspect of the present invention is a resin film having polyimide as a main component, the resin film including a modified layer formed in a depth direction from at least one side of the resin film; and a non-modified layer other than the modified layer, wherein a ring-opening rate of an imide ring of the polyimide in the modified layer is higher than a ring-opening rate of an imide ring of the polyimide in the non-modified layer, and an average thickness of the modified layer from the one side of the resin film is greater than or equal to 10 nm and less than or equal to 500 nm.

In the resin film, the modified layer having a high ring-opening rate of the imide ring of the polyimide is formed in the depth direction from one side, and, therefore, metal atoms are relatively easily bonded to the portion where the imide ring is opened. Particularly, according to the present inventors' knowledge, the portion where the imide ring is opened is present in the depth region of the above-described range from the side on which the metal layer is laminated, and, therefore, the bond between the portion where the imide ring is opened and the metal atoms becomes strong, and the adhesive force between the resin film and the metal layer becomes high. Accordingly, the resin film has an excellent adhesive force with respect to the metal layer.

It is preferable that the ring-opening rate of the imide ring of the polyimide in the modified layer is greater than or equal to 1% and less than or equal to 58%. The ring-opening rate of the imide ring of the polyimide of the above-described modified layer is within the above-described range, and, therefore, it is possible to increase the adhesive force with respect to the metal layer while preventing a decrease in strength caused by the opening of the imide ring.

A printed wiring board substrate according to another aspect of the present invention includes the resin film; and a metal layer laminated on a side of the resin film on which the modified layer is formed.

The metal layer is laminated on the side of the resin film on which the above-described modified layer is formed, and, therefore, the printed wiring board substrate has an excellent adhesive force between the resin film and the metal layer. Further, the printed wiring board substrate has an excellent adhesive force between the resin film and the metal layer, and thus does not require a metal chromium layer or the like using a sputtering method. Therefore, the printed wiring board substrate can be formed relatively inexpensively.

The metal layer may be a sintered body layer of metal particles. In this manner, the above-described metal layer is a sintered body layer of metal particles, and, therefore, a metal layer having an excellent adhesive force with respect to the resin film can be formed at a relatively low cost.

The metal particles may be copper nanoparticles. In this manner, the above-described metal particles are copper nanoparticles, and, therefore, it is easy to form a dense and homogeneous metal layer, and thus it is easy to increase the adhesive force between the resin film and the metal layer.

A printed wiring board according to another aspect of the present invention is a printed wiring board including a resin film having polyimide as a main component; and a metal layer laminated on at least one side of the resin film, wherein the metal layer is patterned in a planar view, and wherein the resin film includes a modified layer formed in a depth direction from the at least one side of the resin film on which the metal layer is laminated; and a non-modified layer other than the modified layer, wherein a ring-opening rate of an imide ring of the polyimide in the modified layer is higher than a ring-opening rate of an imide ring of the polyimide in the non-modified layer, and an average thickness of the modified layer from the at least one side of the resin film on which the metal layer is laminated is greater than or equal to 10 nm and less than or equal to 500 nm.

In the printed wiring board, the modified layer having a high ring-opening rate of the imide ring of polyimide is formed in the depth direction from the side of the resin film on which the metal layer is laminated, and the average thickness of the above-described modified layer from the side on which the above-described metal layer is laminated is within the above-described range, and, therefore, it is relatively easy for metal atoms to bond to the portion where the imide ring is opened. Therefore, the printed wiring board has an excellent adhesive force between the above-described resin film and the metal layer. Further, the printed wiring board has an excellent adhesive force between the above-described resin film and the metal layer, and thus does not require a metal chromium layer or the like using a sputtering method. Therefore, the printed wiring board can be formed relatively inexpensively.

Note that in the present invention, the "main component" means a component having the highest content, for example, a component having a content of greater than or equal to 50% by mass, preferably greater than or equal to 70% by mass, and more preferably greater than or equal to 90% by mass. The "ring-opening rate of an imide ring" means, in the N1s shell bond energy spectrum according to the XPS (X-ray Photoelectron Spectroscopy) measurement, a ratio (N1/(N1+N2)) of a peak area (N1) to a sum (N1+N2), wherein the sum (N1+N2) is the sum of the peak area (N1) that is greater than or equal to 398.2 eV and less than or equal to 399.8 eV, which is the peak (peak derived from the nitrogen atoms of the portion where the imide ring is opened) of the opening of the imide ring of the polyimide, and the peak area (N2) that is greater than or equal to 400.0 eV and less than or equal to 401.6 eV, which is the peak (peak derived from the nitrogen atoms of the imide ring) of the closing of the imide ring of the polyimide ring. The "average thickness of the modified layer" refers to the average value of the thickness of the modified layer at any 10 points. The "average thickness of the modified layer from one side" can be obtained by etching from one side in the depth direction and measuring the degree of ring opening of the imide ring at each depth unit. The "sintered body layer of metal particles" refers to a layer formed by sintering a plurality of metal particles. The "sintering" also includes not only making a completely sintered state in which the particles are firmly bonded, but also making a state in which the particles are in close contact with each other and solid bonded, in a stage prior to reaching a completely sintered state. The "copper nanoparticles" refer to copper particles with a diameter of greater than or equal to 1 nm and less than 1,000 nm.

Details of Embodiments of the Present Invention

Preferred embodiments of the present invention will be described below with reference to the drawings.

First Embodiment

<Resin Film>

A resin film 1 illustrated in FIG. 1 includes polyimide as the main component. The resin film 1 includes a modified layer 2 formed in the depth direction from one side and a non-modified layer 3 other than the modified layer 2. In the resin film 1, the ring-opening rate of the imide ring of the polyimide of the modified layer 2 is higher than the ring-opening rate of the imide ring of the polyimide of the non-modified layer 3. In the resin film 1, the average thickness of the modified layer 2 from the above-described one side is greater than or equal to 10 nm and less than or equal to 500 nm.

In the resin film 1, the modified layer 2, in which the imide ring of the polyimide has a high ring-opening rate, is formed in the depth direction from one side, and, therefore, metal atoms are relatively easily bonded to the ring opening portion of the imide ring. In particular, according to the present inventors' knowledge, the ring opening portion of the imide ring is present in the depth region of the above-described range from the side on which a metal layer is to be laminated, so that the bond between the ring opening portion of the imide ring and the metal atoms will be strong, and the adhesive force between the resin film 1 and the metal layer will be high. Therefore, the resin film 1 has an excellent adhesive force with respect to the metal layer.

As the above-described polyimide, a thermosetting polyimide (also referred to as a condensed polyimide) or a thermoplastic polyimide can be used. Among these, the thermosetting polyimide is preferable from the viewpoints of heat resistance, tensile strength, tensile modulus of elasticity, and the like.

The above-described polyimide may be a homopolymer constituted by one kind of structural unit or a copolymer constituted by two or more kinds of structural units, or may be a blend of two or more kinds of homopolymers; however, the above-described polyimide preferably has the structural unit represented by the following formula (1).

[Chem. 1]

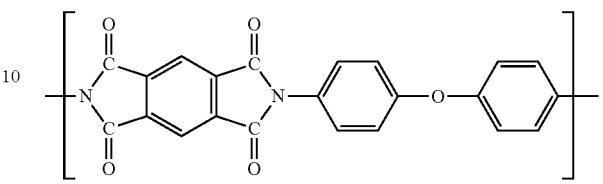

(1)

The structural unit represented by the above formula (1) is obtained, for example, by synthesizing polyamide acid that is a polyimide precursor, by using pyromellitic acid dianhydride and 4,4'-diaminodiphenyl ether, and imidizing the polyamide acid by heating or the like.

As a lower limit of the content of the above-described structural unit, 10% by mass is preferable, 15% by mass is more preferable, and 18% by mass is even more preferable. On the other hand, the upper limit of the content of the above-described structural unit is preferably 50% by mass, more preferably 40% by mass, and even more preferably 35% by mass. When the content of the above-described structural unit is less than the above-described lower limit, the strength of the resin film 1 may be insufficient. Conversely, when the content of the above-described structural unit exceeds the above-described upper limit, the flexibility of the resin film 1 may be insufficient.

The average thickness of the resin film 1 can be set according to the application. When the resin film 1 is used as a base film of a substrate for a printed wiring board as described below, the lower limit of the average thickness of the resin film 1 is preferably 5 µm, and more preferably 12 µm. On the other hand, when the resin film 1 is used as a base film of a substrate for a printed wiring board as described below, the upper limit of the average thickness of the resin film 1 is preferably 2.0 mm, and more preferably 1.6 mm. When the average thickness of the resin film 1 is less than the above-described lower limit, the strength as a base film for a substrate for a printed wiring board may be insufficient. Conversely, when the average thickness of the resin film 1 exceeds the above-described upper limit, it may be difficult to apply the film to electronic devices that require thinning, or the flexibility may be insufficient. Note that "average thickness" means the average value of the thicknesses at any 10 points the resin film 1.

(Modified Layer)

As described above, the modified layer 2 is formed in the depth direction from one side of the resin film 1. Preferably, the modified layer 2 is formed in the entire region of the resin film 1 in a planar view. Note that the "modified layer" refers to a layer in which the imide ring of at least a portion of the polyimide is open. Specifically, the modified layer 2 is a depth region extending until the opening of the ring cannot be confirmed, upon performing etching from one side of the resin film 1 and measuring the presence or absence of the opening of the imide ring by XPS measurement for each depth unit. For example, the modified layer 2 is formed by performing alkaline treatment, plasma treatment, or the like on one side of the resin film 1. Note that "the imide ring is open" means that, in the N1s shell bond energy spectrum according to the XPS measurement, a ratio (N1/(N1+N2)) of a peak area (N1) to a sum (N1+N2) satisfies N1/(N1+N2)

>0.5, wherein the sum (N1+N2) is the sum of the peak area (N1) that is greater than or equal to 398.2 eV and less than or equal to 399.8 eV, which is the peak of the opening of the imide ring of the polyimide, and the peak area (N2) that is greater than or equal to 400.0 eV and less than or equal to 401.6 eV, which is the peak of the closing of the imide ring of the polyimide ring.

As described above, the average thickness of the modified layer 2 from the above-described one side is greater than or equal to 10 nm and less than or equal to 500 nm. The lower limit of the average thickness of the modified layer 2 from the above-described one side is preferably 50 nm and more preferably 100 nm. When the above-described average thickness is less than the above-described lower limit, the adhesive force between the modified layer 2 and the metal layer may be insufficient. On the other hand, the upper limit of the average thickness of the modified layer 2 from the above-described one side is preferably 400 nm and more preferably 300 nm. When the above-described average thickness exceeds the above-described upper limit, the adhesive force between the modified layer 2 and the metal layer is not improved much, while the formation of the modified layer 2 becomes less easy, and the manufacturing cost may be increased. Further, when the above-described average thickness exceeds the above-described upper limit, the strength of the resin film 1 may be insufficient.

The lower limit of the ring-opening rate of the imide ring of the polyimide in the modified layer 2 is preferably 1%, more preferably 5%, and even more preferably 10%. On the other hand, the upper limit of the ring-opening rate of the imide ring of the polyimide of the modified layer 2 is preferably 58%, more preferably 45%, and even more preferably 35%. When the above-described ring-opening rate is less than the above-described lower limit, the adhesive force between the modified layer 2 and the metal layer may be insufficient. Conversely, when the above-described ring-opening rate exceeds the above-described upper limit, the strength of the resin film 1 may be insufficient.

(Non-Modified Layer)

The non-modified layer 3 constitutes the region other than the modified layer 2 of the resin film 1. The non-modified layer 3 is a region in which the imide ring of the polyimide is substantially not open, i.e., a region in which the imide ring of the polyimide is intentionally not opened.

Second Embodiment

<Printed Wiring Board Substrate>

A printed wiring board substrate 11 (a substrate for a printed wiring board) of FIG. 2 includes the resin film 1 of FIG. 1 and a metal layer 12 that is laminated on the side of the resin film 1 on which the modified layer 2 is formed. The printed wiring board substrate 11 is a flexible substrate for a printed wiring board.

In the printed wiring board substrate 11, the metal layer 12 is laminated on the side of the resin film 1 on which the modified layer 2 is formed, and, therefore, the printed wiring board substrate 11 has an excellent adhesive force between the resin film 1 and the metal layer 12. Further, because the printed wiring board substrate 11 has an excellent adhesive force between the resin film 1 and the metal layer 12, there is no need to form a metal chromium layer or the like by using a sputtering method. Therefore, the printed wiring board substrate 11 can be formed by a relatively low cost.

(Resin Film)

The resin film 1 constitutes the base film of the printed wiring board substrate 11. The thickness of the modified layer 2 of the resin film 1 in the printed wiring board substrate 11 can be measured after the metal layer 12 is removed by etching using an acidic solution.

<Etching Method>

The acidic solution used for etching to remove the metal layer 12 can be an acidic etchant generally used for removing a conductive layer, such as a copper chloride liquid solution, hydrochloric acid, sulfuric acid, aqua regia, and the like.

The lower limit of the temperature of the above-described etchant during etching is preferably 10° C. and more preferably 20° C. On the other hand, the upper limit of the temperature of the above-described etchant is preferably 90° C. and more preferably 70° C. When the temperature of the above-described etchant is lower than the above-described lower limit, the time required for etching may be longer, resulting in reduced workability. Conversely, when the temperature of the above-described etchant exceeds the above-described upper limit, the energy cost for temperature adjustment may be unnecessarily increased.

The lower limit of the above-described etching time is preferably 1 minute and more preferably 10 minutes. On the other hand, the upper limit of the above-described etching time is preferably 60 minutes and more preferably 30 minutes. When the above-described etching time is shorter than the above-described lower limit, the concentration of the etchant may become high and the etchant may become difficult to handle. Conversely, when the above-described etching time exceeds the above-described upper limit, the workability may be reduced.

(Metal Layer)

The metal layer 12 is a sintered body layer of metal particles. The metal layer 12 is laminated directly on one side of the resin film 1 (i.e., not via another layer such as an adhesive layer). In the printed wiring board substrate 11, because the metal layer 12 is a sintered body layer of metal particles, the metal layer 12 having an excellent adhesive force with respect to the resin film 1 can be formed at a relatively low cost.

As a lower limit of the average particle size of the above-described metal particles, 1 nm is preferable, 10 nm is more preferable, and 30 nm is even more preferable. On the other hand, the upper limit of the average particle size of the above-described metal particles is preferably 500 nm, more preferably 300 nm, and even more preferably 100 nm. That is, the above-described metal particles are preferably metal nanoparticles having an average particle size within the above-described range. When the above-described average particle size is smaller than the above-described lower limit, the dispersibility and stability of the metal particles in a metal particle dispersion liquid (conductive ink) used in forming the metal layer 12, may be reduced. Conversely, when the above-described average particle size exceeds the above-described upper limit, the metal particles may settle easily in the above-described conductive ink, and also, the density of the metal particles may become uneven when the conductive ink is applied. Note that it is preferable that all of the above-described metal particles are metal nanoparticles; however, the metal particles may include metal nanoparticles and particles other than the metal nanoparticles (i.e., metal particles having a particle size of greater than or equal to 1000 nm). When the metal layer 12 includes above-described metal nanoparticles and metal particles other than these metal nanoparticles, as the lower limit of the content ratio of the above-described metal nanoparticles relative to 100 parts by mass of all of the metal particles, 70 parts by mass is preferable, and 90 parts by mass is more preferable. Note that the "average particle size" means a particle size at which the cumulative volume value is 50% in the distribution of the particle size measured by a laser diffraction method.

The metal layer 12 has a configuration in which the above-described plural metal particles are adhered to each other by a metal oxide or the like. The metal constituting the above-described metal particles include copper, nickel, aluminum, gold, silver, and the like. Among these, copper having excellent electrical conductivity, adhesive force with respect to the resin film 1, and etching properties, is preferable. When the metal constituting the above-described metal particles is copper, the metal atoms can be easily strongly bonded to the opened portion of the imide ring of the polyimide of the modified layer 2 of the resin film 1. In particular, it is preferable that the above-described metal particles are copper nanoparticles. When the above-described metal particles are copper nanoparticles, a dense and homogeneous metal layer 12 can be easily formed, and thus the adhesive force between the resin film 1 and the metal layer 12 is easily increased.

The lower limit of the average thickness of the metal layer 12 is preferably 10 nm, more preferably 50 nm, and even more preferably 100 nm. On the other hand, the upper limit of the average thickness of the metal layer 12 is preferably 1000 nm, more preferably 700 nm, and even more preferably 500 nm. When the average thickness of the metal layer 12 is less than the above-described lower limit, a break may be formed in the metal layer 12 in a planar view and the conductivity of the metal layer 12 may be reduced. Conversely, when the average thickness of the metal layer 12 exceeds the above-described upper limit, and the metal layer 12 is applied, for example, to wiring formation by the semi-additive method, it may take a long time to remove the metal layer 12 between the conductive patterns and the productivity may be reduced.

Third Embodiment

<Printed Wiring Board Substrate>

A printed wiring board substrate 21 (a substrate for a printed wiring board) of FIG. 3 includes the printed wiring board substrate 11 of FIG. 2 and an electroless plating layer 22 that is laminated on the outer side (the side opposite to the side laminated with the resin film 1) of the metal layer 12 (the sintered body layer) of the printed wiring board substrate 11. The printed wiring board substrate 21 is a flexible printed wiring board substrate.

(Electroless Plating Layer)

The electroless plating layer 22 is formed of an electroless plating metal. The electroless plating metal is filled into the voids of the sintered body constituting the metal layer 12, and is laminated on the outer side of the above-described sintered body. The electroless plating metal is preferably filled into all the voids in the above-described sintered body. In the printed wiring board substrate 21, because the electroless plating metal is filled into the voids of the above-described sintered body, it is possible to prevent the metal layer 12 from peeling away from the resin film 1 due to the void portions of the above-described sintered body becoming break starting points.

Examples of the metals constituting the electroless plating layer 22 include copper, nickel, cobalt, gold, silver, tin, alloys thereof, and the like. Among these, copper, which is relatively inexpensive and has excellent etching properties, is preferable. That is, the electroless plating layer 22 is preferably formed of electroless copper plating.

The lower limit of the average thickness of the electroless plating layer 22 is preferably 50 nm, more preferably 100 nm, and even more preferably 200 nm. On the other hand, the upper limit of the average thickness of the electroless plating layer 22 is preferably 2.0 µm, more preferably 1.5 µm, and even more preferably 1.0 µm. When the average thickness of the electroless plating layer 22 is less than the above-described lower limit, it may not be possible to sufficiently fill the electroless plating metal into the voids of the above-described sintered body. Conversely, when the average thickness of the electroless plating layer 22 exceeds the above-described upper limit, the time required for electroless plating may be prolonged and productivity may be reduced. Note that the "average thickness of the electroless plating layer" means the average value of the thickness direction distance between the outer side of the electroless plating layer 22 and the interface of the electroless plating layer 22 and the metal layer 12, at any 10 points.

Fourth Embodiment

<Printed Wiring Board Substrate>

A printed wiring board substrate 31 (a substrate for a printed wiring board) of FIG. 4 includes the printed wiring board substrate 21 of FIG. 3 and an electroplating layer 32 that is laminated on the outer side (the side opposite to the side laminated with the resin film 1) of the electroless plating layer 22 of the printed wiring board substrate 21. The printed wiring board substrate 31 is a flexible printed wiring board substrate.

(Electroplating Layer)

The electroplating layer 32 is formed of an electroplating metal. The printed wiring board substrate 31 includes the electroplating layer 32, and, therefore, it is possible to easily and reliably adjust the thickness of a conductive pattern 42 of a printed wiring board 41 described below formed by using the printed wiring board substrate 31.

Examples of the metals constituting the electroplating layer 32 include copper, nickel, cobalt, gold, silver, tin, alloys thereof, and the like. Among these, copper, which is relatively inexpensive and has excellent etching properties, is preferable. That is, the electroplating layer 32 is preferably formed by electrocopper plating.

The average thickness of the electroplating layer 32 is set depending on what kind of printed circuit is fabricated and is thus not particularly limited, but may be, for example, greater than or equal to 1 µm and less than or equal to 100 µm.

Fifth Embodiment

<Printed Wiring Board>

The printed wiring board 41 of FIG. 5 includes the resin film 1 of FIG. 1 having polyimide as a main component and the metal layer 12 laminated on one side of the resin film 1, wherein the metal layer 12 is patterned in a planar view. Specifically, the printed wiring board 41 uses the printed wiring board substrate 31 of FIG. 4, in which the metal layer 12, the electroless plating layer 22, and the electroplating layer 32 are laminated in the stated order on one side of the resin film 1. The printed wiring board 41 includes the conductive pattern 42 that is obtained by patterning a laminated body constituted by the metal layer 12, the electroless plating layer 22, and the electroplating layer 32. In this case, as the patterning method, for example, a method (subtractive method) in which the above-described laminated body is etched by applying masking such as a resist pattern or the like on the above-described laminated body, can be used. The printed wiring board 41 is a flexible printed wiring board.

In the printed wiring board 41, the resin film 1 includes the modified layer 2 formed in the depth direction from the side on which the metal layer 12 is laminated, and the non-modified layer 3 other than the modified layer 2. In the printed wiring board 41, the ring-opening rate of the imide ring of the polyimide of the modified layer 2 is higher than the ring-opening rate of the imide ring of the polyimide of the non-modified layer 3. The average thickness of the modified layer 2 from the side of the resin film 1 on which the metal layer 12 is laminated, is greater than or equal to 10 nm and less than or equal to 500 nm, as described above.

In the printed wiring board 41, the modified layer 2 in which the ring-opening rate of the imide ring of the polyimide is high, is formed in the depth direction from the side of the resin film 1 on which the metal layer 12 is laminated, and the average thickness of the modified layer 2 from the side on which the metal layer 12 is laminated is within the above-described range, and, therefore, the metal atoms are relatively easily bonded to the ring opening portion of the imide ring. Thus, the printed wiring board 41 has an excellent adhesive force between the resin film 1 and the metal layer 12. Further, because the printed wiring board 41 has an excellent adhesive force between the resin film 1 and the metal layer 12, there is no need to form a metal chromium layer or the like by using a sputtering method. Thus, the printed wiring board 41 can be formed by a relatively low cost.

<Method of Manufacturing Resin Film>

Next, a method of manufacturing the resin film 1 of FIG. 1 will be described with reference to FIG. 6A. The method of manufacturing the resin film includes a process of performing alkaline treatment (an alkaline treatment process) on one side of the substrate film that is not modified, having polyimide as the main component.

By the method of manufacturing the resin film, the resin film 1 having an excellent adhesive force to the metal layer, can easily and reliably manufactured.

(Alkaline Treatment Process)

In the above-described alkaline treatment process, an alkaline liquid is brought into contact with one side of the above-described substrate film, to open a portion of the imide ring of the polyimide over a depth range that is greater than or equal to 10 nm and less than or equal to 500 nm, from one side of the above-described substrate film. By this alkaline treatment process, the modified layer 2 is formed in the depth direction from one side of the substrate film. Accordingly, the resin film 1 described above is formed, having the modified layer 2 and the non-modified layer 3 other than the modified layer 2, wherein the ring-opening rate of the imide ring of the polyimide of the modified layer 2 is higher than the ring-opening rate of the imide ring of the polyimide of the non-modified layer 3.

Examples of the alkaline liquid used in the above-described alkaline treatment process include an aqueous solution such as sodium hydroxide, potassium hydroxide, ammonia, calcium hydroxide, tetramethylammonium hydroxide, lithium hydroxide, and monoethanolamine, or an aqueous solution including the aforementioned aqueous solution and hydrogen peroxide; generally, an aqueous solution of sodium hydroxide is used.

The pH of the alkaline liquid used in the above-described alkaline treatment process may be, for example, greater than or equal to 12 and less than or equal to 15. Further, the contact time of above-described substrate film and the alkaline liquid may be, for example, greater than or equal to 10 seconds and less than or equal to 10 minutes. The temperature of the alkaline liquid may be, for example, greater than or equal to 10° C. and less than or equal to 70° C.

It is preferable that the above-described alkaline treatment process includes a water washing process of washing, with water, the above-described substrate film after contact with the alkaline liquid. In the water washing process, the above-described substrate film after contact with the alkaline liquid is washed with water to remove the alkaline liquid adhering to the surface of the substrate film. It is further preferable that the above-described alkaline treatment process includes a drying process of drying the washing water after the above-described water washing process. The quality of the obtained resin film 1 can be stabilized by precipitation of ions in the above-described substrate film as metals or metal oxides or bonding the ions in the above-described substrate film with resin components of the above-described substrate film, by vaporizing moisture in the substrate film.

<Method of Manufacturing Printed Wiring Board Substrate>

Next, a method of manufacturing a substrate for a printed wiring board (printed wiring board substrate) using the resin film 1, will be described with reference to FIGS. 6B to 6E.

First, a method of manufacturing the printed wiring board substrate 11 of FIG. 2 will be described with reference to FIGS. 6B and 6C. The method of manufacturing the printed wiring board substrate includes a coating film forming process of forming a coating film 52 on the side of the resin film 1 on which the modified layer 2 is formed by applying a conductive ink containing metal particles 51, and a sintered body layer forming process of forming a sintered body layer 12 (the metal layer 12 in FIG. 2) of the metal particles 51 by firing the coating film 52.

<Coating Film Forming Process>

In the above-described coating film forming process, as illustrated in FIG. 6B, a conductive ink including the metal particles 51 is applied to the side of the resin film 1 on which the modified layer 2 is formed, and the conductive ink is dried to form the coating film 52. Note that the coating film 52 may include a dispersion medium or the like of the above-described conductive ink.

<Metal Particles>

The metal particles 51 dispersed in the above-described conductive ink may be manufactured by a high-temperature treatment process, a liquid phase reduction process, a gas phase process, or the like. Among these, by the liquid phase reduction method, the manufacturing cost can be further reduced, and by agitation in an aqueous solution or the like, the particle size of the metal particles 51 can be easily made uniform. As the metal particles 51 are manufactured as described above by a high-temperature treatment method, a liquid phase reduction method, a gas phase method, or the like, the average particle size is adjusted, for example, to greater than or equal to 1 nm and less than or equal to 500 nm.

In order to manufacture the metal particles 51 by the liquid phase reduction method, for example, a process is to be performed to dissolve, in water, the water-soluble metal compound and the dispersing agent that are the basis of the metal ions forming the metal particles 51, and to cause a reduction reaction with respect to the metal ions for a certain period of time by adding a reducing agent. By the liquid phase reduction method, the manufactured metal particles 51 have uniform spherical or particulate shapes and can be fine particles. Examples of the water-soluble metal compound that is the basis of the above-described metal ions are, in the case of copper, copper nitrate (II) ($Cu(NO_3)_2$), and copper sulfate (II) pentahydrate ($CuSO_4 \cdot 5H_2O$) and the like. Further, in the case of silver, examples include silver nitrate (I) ($AgNO_3$), silver methanesulfonate ($CH_3SO_3Ag$), etc.; in the case of gold, examples include hydrogen tetrachloroaurate (III) tetrahydrate ($HAuCl_4 \cdot 4H_2O$); and in the case of nickel, examples include nickel (II) chloride hexahydrate ($NiCl_2 \cdot 6H_2O$) and nickel (II) nitrate hexahydrate ($Ni(NO_3)_2 \cdot 6H_2O$), etc. With respect to other metal particles, a water-soluble compound such as chloride, a nitrate compound, a sulfate compound and the like may also be used.

As the above-described reducing agent, various reducing agents capable of reducing and precipitating metal ions in a reaction system of a liquid phase (aqueous solution) can be used. Examples of the reducing agent include sodium borohydride, sodium hypophosphite, hydrazine, ions of transition metals such as trivalent titanium ions and divalent cobalt ions, ascorbic acid, reducing sugars such as glucose and fructose, and polyhydric alcohols such as ethylene glycol and glycerin. Among these, trivalent titanium ions are preferable as the above-described reducing agent. Note that the liquid phase reduction method using trivalent titanium ions as a reducing agent is referred to as a titanium redox method. In the titanium redox method, metal ions are reduced by the oxidation-reduction action when trivalent titanium ions are oxidized to tetravalent titanium ions, and the metal particles 51 are precipitated. The metal particles 51 obtained by the titanium redox method are small in size and are uniform, and, therefore, the metal particles 51 can be filled more densely and the coating film 52 can be formed into a denser film.

In order to adjust the particle size of the metal particles 51, the type and the compound ratio of the metal compound, the dispersing agent, and the reducing agent may be adjusted, and also, when the metal compound is subjected to a reduction reaction, the agitation rate, the temperature, the time, the pH and the like may be adjusted. The lower limit of the pH of the reaction system is preferably 7, and the upper limit of the pH of the reaction system is preferably 13. By setting the pH of the reaction system to the above-described range, it is possible to obtain the metal particles 51 having a small particle size. In this case, by using a pH adjusting agent, it is possible to easily adjust the pH of the reaction system to the above-described range. As the pH adjusting agent, a general acid or alkali such as hydrochloric acid, sulfuric acid, nitric acid, sodium hydroxide, sodium carbonate, and ammonia may be used. However, especially in order to prevent deterioration of the peripheral members, nitric acid and ammonia, which do not contain impurities, such as alkaline metal, alkaline earth metal, halogen element, sulfur, phosphorus, boron and the like, are preferable.

As a lower limit of the average particle size of the metal particles 51, 1 nm is preferable, 10 nm is more preferable, and 30 nm is even more preferable. On the other hand, the upper limit of the average particle size of the metal particles 51 is preferably 500 nm, more preferably 300 nm, and even more preferably 100 nm. When the average particle size of the metal particles 51 is smaller than the above-described lower limit, the dispersibility and stability of the metal particles 51 in conductive ink may be reduced. On the other hand, when the average particle size of the metal particles 51 exceeds the above-described upper limit, the metal particles 51 may settle easily, and the density of the metal particles 51 may become uneven when conductive ink is applied.

As a lower limit of the content ratio of the metal particles 51 in the conductive ink, 5% by mass is preferable, 10% by mass is more preferable, and 20% by mass is even more preferable. Further, the upper limit of the content ratio of the metal particles 51 in the conductive ink is preferably 50% by mass, more preferably 40% by mass, and even more preferably 30% by mass. By setting the content ratio of the metal particles 51 to be greater than or equal to the above-described lower limit, the coating film 52 can be formed into a denser film. On the other hand, when the content ratio of the metal particles 51 exceeds the above-described upper limit, the film thickness of the coating film 52 may be uneven.

<Other Components>

The above-described conductive ink may include a dispersing agent other than the metal particles 51. The dispersing agent is not particularly limited, and various dispersing agents that are capable of sufficiently dispersing the metal particles 51 may be used.

The above-described dispersing agent preferably does not contain sulfur, phosphorus, boron, halogen, or alkali from the viewpoint of preventing deterioration of peripheral members. Preferable dispersing agents include nitrogen-containing polymer dispersing agents such as polyethyleneimine and polyvinylpyrrolidone; hydrocarbon-based polymer dispersing agents having a carboxy group in a molecule such as polyacrylic acid and carboxymethylcellulose; polymer dispersing agents having a polar group such as poval (polyvinyl alcohol), styrene-maleic acid copolymer, olefin-maleic acid copolymer, copolymer having a polyethyleneimine moiety and a polyethylene oxide moiety in one molecule, and the like.

The lower limit of the molecular weight of the dispersing agent is preferably 2,000, and the upper limit of the molecular weight of the dispersing agent is preferably 30,000. By using a dispersing agent having the molecular weight in the above-described range, the metal particles 51 can be sufficiently dispersed in the conductive ink, so that the film quality of the coating film 52 can be dense and free of defects. When the molecular weight of the above-described dispersing agent is less than the above-described lower limit, the effect of preventing agglomeration and maintaining the dispersion of the metal particles 51 may not be sufficiently obtained. Conversely, when the molecular weight of the above-described dispersing agent exceeds the above-described upper limit, the dispersing agent is too bulky, and sintering of the metal particles 51 may be inhibited during firing of the coating film 52, resulting in voids. Further, if the dispersing agent is too bulky, the density of the coating film 52 may be reduced, and the decomposition residue of the dispersing agent may decrease the conductivity.

The above-described dispersing agent may also be compounded into a conductive ink in the form of a solution dissolved in water or a water-soluble organic solvent. When the dispersing agent is compounded into a conductive ink, the lower limit of the content ratio of the dispersing agent is preferably one part by mass with respect to 100 parts by mass of the metal particles 51. On the other hand, the upper limit of the content ratio of the dispersing agent is preferably 60 parts by mass with respect to 100 parts by mass of the metal particles 51. When the content ratio of the above-described dispersing agent is less than the above-described lower limit, the agglomeration prevention effect of the metal particles 51 may be insufficient. Conversely, when the content ratio of the above-described dispersing agent exceeds the above-described upper limit, there may be a case where the excess dispersing agent inhibits the sintering of the metal particles 51 when the coating film 52 is fired, and voids may be generated. Further, the decomposition residue of the dispersing agent may remain in the sintered body layer 12 as an impurity, thereby decreasing the conductivity.

As the dispersion medium in the above-described conductive ink, for example, water may be used. When the dispersion medium is water, as the lower limit of the content ratio of water, 20 parts by mass is preferable with respect to 100 parts by mass of the metal particles 51. Further, as the upper limit of the content ratio of water, 1,900 parts by mass is preferable with respect to 100 parts by mass of the metal particles 51. The water that is the dispersion medium serves, for example, to sufficiently swell the dispersing agent and to sufficiently disperse the metal particles 51 surrounded by the dispersing agent; however, when the above-described content ratio of the water is less than the above-described lower limit, the swelling effect of the dispersing agent may not be sufficient. On the other hand, when the above-described content ratio of the water exceeds the above-described upper limit, the content ratio of the metal particles 51 in the conductive ink decreases, so that the preferable sintered body layer 12 having the necessary thickness and density may not be formed.

As the organic solvent to be compounded with the above-described conductive ink according to need, various organic solvents that are water soluble can be used. Specific examples include alcohols such as methyl alcohol, ethyl alcohol, n-propyl alcohol, isopropyl alcohol, n-butyl alcohol, isobutyl alcohol, sec-butyl alcohol, tert-butyl alcohol; ketones such as acetone and methyl ethyl ketone; polyhydric alcohols and other esters such as ethylene glycol and glycerin; glycol ethers such as ethylene glycol monoethyl ether and diethylene glycol monobutyl ether, and the like.

The content ratio of the water-soluble organic solvent is preferably greater than or equal to 30 parts by weight and less than or equal to 900 parts by weight per 100 parts by weight of the metal particles. When the content ratio of the above-described water-soluble organic solvent is less than the above-described lower limit, the effects of adjustment of viscosity and adjustment of vapor pressure of the metal particle dispersion liquid (conductive ink) by the above-described organic solvent may not be sufficiently obtained. Conversely, when the content ratio of the above-described water-soluble organic solvent exceeds the above-described upper limit, the swelling effect of the dispersing agent caused by water is insufficient, and agglomeration of the metal particles 51 may occur in the conductive ink.

Note that when the metal particles 51 are manufactured by the liquid phase reduction method, the metal particles 51 precipitated in the reaction system of the liquid phase (aqueous solution) are subjected to the processes of filtration, washing, drying, disintegrating, etc., to be once powdered, and this powder may be used to prepare the conductive ink. In this case, the powdered metal particles 51, a dispersion medium such as water, and according to need, a dispersing agent, an organic solvent, or the like may be compounded at a predetermined ratio to form a conductive ink including the metal particles 51. At this time, it is preferable to prepare a conductive ink by using a liquid phase (aqueous solution) in which the metal particles 51 are precipitated, as a starting material. Specifically, the liquid phase (aqueous solution) including the precipitated metal particles 51 is subjected to treatment such as ultrafiltration, centrifugation, water washing, and electrodialysis to remove impurities, and is then concentrated according to need to remove water. Alternatively, a conductive ink including the metal particles 51 may be prepared by adding water to adjust the concentration of the metal particles 51, followed by compounding an organic solvent at a predetermined ratio according to need. By this method, the generation of coarse and amorphous particles due to agglomeration of the metal particles 51 during drying is prevented, and the dense, uniform sintered body layer 12 can be easily formed.

<Method of Applying Conductive Ink>

A method of applying a conductive ink in which the metal particles 51 are dispersed, to the side of the resin film 1 on which the modified layer 2 is formed, may be a conventionally known application method such as a spin coating method, a spray coating method, a bar coating method, a die coating method, a slit coating method, a roll coating method, a dip coating method, or the like. Further, the conductive ink may be applied only to a portion of the side of the resin film 1 on which the modified layer 2 is formed, by screen printing, a dispenser, or the like. After application of the conductive ink, the coating film 52 is formed, for example, by drying at a temperature above room temperature. As an upper limit of the drying temperature, 100° C. is preferable and 40° C. is more preferable. When the drying temperature exceeds the above-described upper limit, a crack may be formed in the coating film 52 due to rapid drying of the coating film 52.

[Sintered Body Layer Forming Process]

Figure 6C:
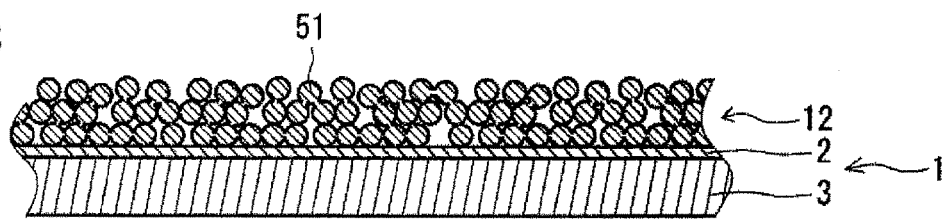
FIG. 6C is a schematic cross-sectional view illustrating a metal layer forming process of a method of manufacturing the printed wiring board substrate in FIG. 2.

In the above-described sintered body layer forming process, as illustrated in FIG. 6C, the sintered body layer 12 of the metal particles 51 are formed by firing the coating film 52.

<Firing>

As a result of the above-described firing, the metal particles 51 are sintered and the sintered body is adhered to the side of the resin film 1 on which the modified layer 2 is famed. Note that the dispersing agent and other organic substances that may be included in the conductive ink are volatilized or decomposed by firing. Further, near the interface between the sintered body and the resin film 1, the metal particles 51 are oxidized by firing, and, therefore, metal oxide based on the metal particles 51 or a group derived from the metal oxide is generated while preventing the generation of the metal hydroxide based on the metal particles 51 or a group derived from the metal hydroxide. The metal oxide and the group derived from the metal oxide generated near the interface between the sintered body and the resin film 1 is strongly bonded to the ring-opening portion of the imide ring of the polyimide that constitutes the resin film 1, and, therefore, the adhesive force between the resin film 1 and the sintered body layer 12 increases.

The above-described firing is preferably performed in an atmosphere including a certain amount of oxygen in order to promote oxidation of the metal particles 51 near the interface between the sintered body and the resin film 1. In this case, as a lower limit of the oxygen concentration in the firing atmosphere, 1 volume ppm is preferable, and 10 volumes ppm is more preferable. On the other hand, the upper limit of the above-described oxygen concentration is preferably 10,000 volumes ppm and more preferably 1,000 volumes ppm. When the above-described oxygen concentration is less than the above-described lower limit, the generation amount of the metal oxide and the group derived from the metal oxide near the interface between the sintered body and the resin film 1 is reduced, and the adhesive force between the resin film 1 and the sintered body layer 12 may not be sufficiently improved. Conversely, when the above-described oxygen concentration exceeds the above-described upper limit, the conductivity of the sintered body layer 12 may be reduced due to excessive oxidation of the metal particles 51.

As the lower limit of the temperature of the above-described firing, 150° C. is preferable, and 200° C. is more preferable. On the other hand, as the upper limit of the temperature of the above-described firing, 500° C. is preferable, and 400° C. is more preferable. When the temperature of the above-described firing is less than the above-described lower limit, the generation amount of the metal oxide and a group derived from the metal oxide near the interface between the sintered body and the resin film 1 is reduced, and the adhesive force between the resin film 1 and the sintered body layer 12 may not be sufficiently improved. Conversely, when the temperature of the above-described firing exceeds the above-described upper limit, the resin film 1 may deform. Note that although the firing time is not particularly limited, for example, the firing time may be in a range of 30 minutes or more and 600 minutes or less.

Figure 6D:
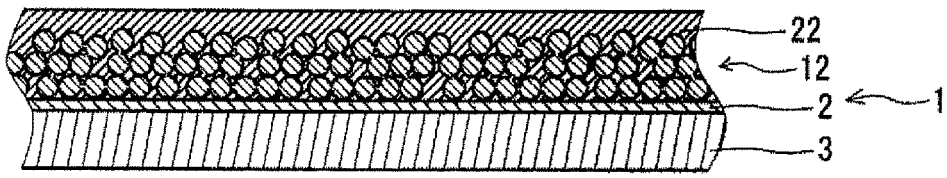
FIG. 6D is a schematic cross-sectional view illustrating an electroless plating layer laminating process of the method of manufacturing the printed wiring board substrate of FIG. 3.

Next, a method of manufacturing the printed wiring board substrate 21 of FIG. 3 will be described with reference to FIG. 6D. The method of manufacturing the printed wiring board substrate 21 includes an electroless plating layer laminating process in which the electroless plating layer 22 is laminated on the outer side (the side opposite to the side laminated with the resin film 1) of the sintered body layer 12 after the sintered body layer forming process.

[Electroless Plating Layer Laminating Process]

Metals used for electroless plating in the above-described electroless plating layer laminating process include copper, nickel, cobalt, gold, silver, tin, and the like, and among these, copper is preferable. The procedure of the above-described electroless plating is not particularly limited; for example, electroless plating may be performed by a known means along with treatment such as a cleaner process, a water washing process, an acid treatment process, a water washing process, a predipping process, an activator process, a water washing process, a reduction process, and a water washing process, and the like.

Further, it is preferable that heat treatment is performed after the electroless plating layer 22 is formed. When heat treatment is performed after forming the electroless plating layer 22, the metal oxide and the like near the interface between the sintered body layer 12 and the resin film 1 is further increased, and the adhesive force between the resin film 1 and the sintered body layer 12 is further increased. The temperature and oxygen concentration of the heat treatment after electroless plating can be the same as the firing temperature and oxygen concentration in the above-described sintered body layer forming process.

Figure 6E:
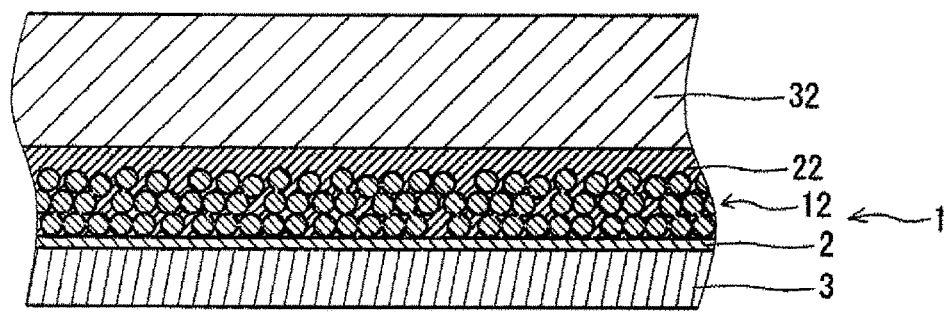
FIG. 6E is a schematic cross-sectional view illustrating an electroplating layer laminating process of the method of manufacturing the printed wiring board substrate of FIG. 4.

Next, a method of manufacturing the printed wiring board substrate 31 illustrated in FIG. 4 will be described with reference to FIG. 6E. The method of manufacturing the printed wiring board substrate includes an electroplating layer laminating process in which the electroplating layer 32 is laminated on the outer side (the side opposite to the side laminated with the resin film 1) of the electroless plating layer 22 after the electroless plating layer laminating process.

[Electroplating Layer Laminating Process]

Metals used for electroplating in the above-described electroplating layer laminating process include copper, nickel, cobalt, gold, silver, tin, and the like, and among these, copper is preferable. The above-described electroplating procedure is not particularly limited, and may be suitably selected from known electroplating baths and plating conditions, for example. By this electroplating layer laminating process, the thickness of the conductive pattern 42 of the printed wiring board 41 of FIG. 5 formed using the printed wiring board substrate 31 is adjusted to a desired thickness.

OTHER EMBODIMENTS

The embodiments disclosed herein should be considered to be exemplary in all respects and not restrictive. The scope of the present invention is not limited to the configuration of the above embodiments, but is set forth by the appended claims, and is intended to include all modifications within the meaning and scope equivalent to the claims.

For example, the resin film may be formed by a pair of modified layers from both sides in the depth direction. In this case, a metal layer may be laminated on both sides of the resin film. Further, the resin film may not necessarily be used as a substrate for a printed wiring board.

As long as the printed wiring board substrate and the printed wiring board have a metal film laminated on the side of the resin film on which the modified layer is formed, the specific configuration of the metal layer is not particularly limited. Further, when the above-described metal layer is a sintered body layer of metal particles, an electroplating layer may be directly laminated on the outer side of the sintered body layer. Further, it will suffice as long as the electroless plating metal formed by electroless plating is filled into voids of the sintered body, and the electroless plating metal does not necessarily need to be laminated on the outer side of the sintered body layer.

The printed wiring board does not necessarily need to use the printed wiring board substrate 31 illustrated in FIG. 4, as long as the printed wiring board uses a printed wiring board substrate in which a metal layer is laminated on the side of the resin film on which the modified layer is formed.

In the method of manufacturing the resin film, for example, the modified layer may be formed by performing plasma treatment or the like on one side of the non-modified substrate film having polyimide as the main component.

Although the above embodiment has been described as an example where a conductive pattern is formed by a subtractive method, the printed wiring board may have a conductive pattern formed by a semi-additive method.

PRACTICAL EXAMPLES

The present invention will be described in further detail in the following practical examples; however, the present invention is not limited to the practical examples.

The surface of a commercially available polyimide film ("Apical NPI" manufactured by KANEKA CORPORATION) was alkaline treated by immersing the surface in an aqueous sodium hydroxide solution having a concentration of 9% by mass at a temperature of 40° C. for a period of time as indicated in Table 1 (however, the polyimide film No. 1 was not treated). Subsequently, these polyimide films were sputter etched with C60 at an accelerating voltage of 10 kV and XPS-measured every 3 nm to obtain N1s shell bond energy spectrum information. Note that as the XPS measuring device, a "VersaProbe" manufactured by ULVAC-PHI, Inc. was used, and a monochromatized Al (1486.6 eV) was used as the X-ray source, and the detection region was measured at 100 μφ with a detection depth of 4 nm to 5 nm (extraction angle of 45°).

Further, copper nanoink (a metal particle dispersion liquid including 26% by mass of copper nanoparticles having an average particle diameter of 80 nm) was applied to the surfaces of these polyimide films and dried, and a first metal layer (a sintered body layer) was laminated by firing in a nitrogen atmosphere of 350° C. for 2 hours. Next, by electroless copper plating, copper was laminated so as to have an average total thickness of 0.5 pin, and a second metal layer (electroless plating layer) was laminated by firing in a nitrogen atmosphere of 350° C. for two hours. Further, copper was laminated by electrocopper plating, and a third metal layer (electroplating layer) was laminated so as to have an average total thickness of 20 μm.

(Average Thickness of Modified Layer)

In the XPS measurement of the N1s shell bond energy spectrum, any 10 points having a thickness satisfying N1/(N1+N2)>0.5 were measured, wherein (N1/(N1+N2)) is the ratio of the peak area (N1) with respect to the sum (N1+N2) of the peak area (N1) of greater than or equal to 398.2 eV and less than or equal to 399.8 eV, which is the opening peak of the imide ring in polyimide, and the peak area (N2) of greater than or equal to 400.0 eV and less than or equal to 401.6 eV, which is the closing peak of the imide ring in polyimide. The average value of the measured thicknesses was calculated as the average thickness of the modified layer. The calculation results are indicated in Table 1.

(Opening Rate of Imide Ring)

In the XPS measurement of the N1s shell bond energy spectrum, the ring-opening rate of the imide ring in the polyimide was measured according to the ratio (N1/(N1+N2)) of the peak area (N1) with respect to the sum (N1+N2) of the peak area (N1) of greater than or equal to 398.2 eV and less than or equal to 399.8 eV, which is the opening peak of the imide ring in polyimide, and the peak area (N2) of greater than or equal to 400.0 eV and less than or equal to 401.6 eV, which is the closing peak of the imide ring in polyimide. The measurement results are indicated in Table 1.

(Peel Strength)

The peel strength of the metal layer was measured by using a polyimide film as a flexible adhesive according to JIS-K6854-2 (1999) "Adhesive-peel adhesive strength test method-Part 2: 180 degrees peel off". The results of this measurement are indicated in Table 1.

layer easily enter into the thickness direction of the modified layer, and the contact area of the polyimide and the copper nanoparticles becomes large. Further, it is considered that the entering depth of the copper nanoparticles increases corresponding to the modification thickness when the average thickness of the modified layer is less than a certain value, and that the depth of entrance of the copper nanoparticles is maintained at a substantially constant level when the average thickness of the modified layer exceeds a certain value. Specifically, the upper limit of the depth of entrance of copper nanoparticles into the modified layer is approximately 20 nm. On the other hand, when the thickness of the modified layer increases too much, the peel strength with the metal layer decreases due to the decrease in the strength of the polyimide film. As a result, it is considered that the peel strength with the metal layer is particularly high for the polyimide films No. 5 to No. 8 in which the modified layer has an average thickness of 75 nm to 261 nm. Note that as described above, the depth of entrance of copper nanoparticles into the modified layer hardly becomes larger than a certain level, and, therefore, it is unlikely that the smoothness of the surface of the modified layer is impaired due to excessive entrance of copper nanoparticles. Therefore, it is unlikely that the etching property of the metal layer laminated on the surface of the modified layer is reduced.

REFERENCE SIGNS LIST 1 resin film, 2 modified layer, 3 non-modified layer,
11, 21, 31 printed wiring board substrate, 12 metal layer (sintered body layer)
22 electroless plating layer, 32 electroplating layer, 41 printed wiring board
42 conductive pattern, 51 metal particles, 52 coating film

TABLE 1

|  | ALKALINE TREATMENT TIME [s] | AVERAGE THICKNESS OF MODIFIED LAYER [nm] | RING OPENING RATE OF IMIDE RING OF MODIFIED LAYER [%] | PEEL STRENGTH [N/cm] |
|---|---|---|---|---|
| No. 1 | 0 | 0 | 0 | 3.2 |
| No. 2 | 3 | 9 | 1 | 5.4 |
| No. 3 | 10 | 21 | 2 | 8.1 |
| No. 4 | 30 | 51 | 5 | 8.5 |
| No. 5 | 60 | 75 | 10 | 9.8 |
| No. 6 | 90 | 129 | 16 | 10.4 |
| No. 7 | 120 | 171 | 21 | 11.1 |
| No. 8 | 180 | 261 | 30 | 10.1 |
| No. 9 | 270 | 372 | 46 | 8.8 |
| No. 10 | 360 | 516 | 58 | 4.9 |

<Evaluation Results>

As indicated in Table 1, the polyimide films No. 3 to No. 9, in which the average thickness of the modified layer from the surface of the polyimide film is included in the range of greater than or equal to 10 nm and less than or equal to 500 nm, have a high peel strength with the metal layer of greater than or equal to 8.1 N/cm or more. Among these, the polyimide films No. 5 to No. 8 in which the average thickness of the modified layer is 75 nm to 261 nm and the opening rate of the imide ring of the polyimide in the modified layer is 10% to 30%, have a particularly excellent peel strength with the metal layer. This is considered to be because, when the ring-opening rate of the imide ring of the polyimide is relatively high at 10% or more, the copper nanoparticles constituting the above-described first metal

The invention claimed is:

1. A resin film having polyimide as a main component, the resin film comprising:
   a modified layer formed in a depth direction from at least one side of the resin film; and
   a non-modified layer other than the modified layer, wherein
   a ring-opening rate of an imide ring of the polyimide in the modified layer is higher than a ring-opening rate of an imide ring of the polyimide in the non-modified layer, and
   an average thickness of the modified layer from the one side of the resin film is greater than or equal to 10 nm and less than or equal to 500 nm.

2. The resin film according to claim 1, wherein the ring-opening rate of the imide ring of the polyimide in the modified layer is greater than or equal to 1% and less than or equal to 58%.

3. A substrate for a printed wiring board comprising:
   the resin film according to claim 1; and
   a metal layer laminated on a side of the resin film on which the modified layer is formed.

4. The substrate for the printed wiring board according to claim 3, wherein the metal layer is a sintered body layer of metal particles.

5. The substrate for the printed wiring board according to claim 4, wherein the metal particles are copper nanoparticles.

6. A printed wiring board comprising:
   a resin film having polyimide as a main component; and
   a metal layer laminated on at least one side of the resin film, wherein
   the metal layer is patterned in a planar view, and wherein the resin film includes:
      a modified layer formed in a depth direction from the at least one side of the resin film on which the metal layer is laminated; and
      a non-modified layer other than the modified layer, wherein
         a ring-opening rate of an imide ring of the polyimide in the modified layer is higher than a ring-opening rate of an imide ring of the polyimide in the non-modified layer, and
         an average thickness of the modified layer from the at least one side of the resin film on which the metal layer is laminated is greater than or equal to 10 nm and less than or equal to 500 nm.

* * * * *